Figure 1:
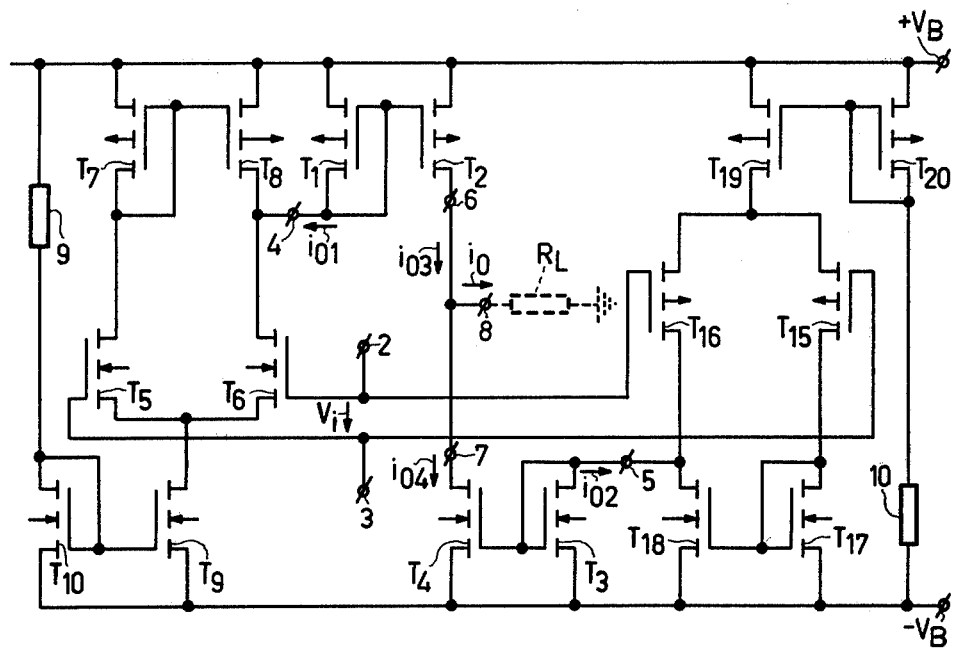

United States Patent [19]
Van de Sande

[11] 4,152,663
[45] May 1, 1979

[54] AMPLIFIER ARRANGEMENT

[75] Inventor: Petrus A. M. Van de Sande, Nijmegen, Netherlands

[73] Assignee: U.S. Philips Corporation, New York, N.Y.

[21] Appl. No.: 868,810

[22] Filed: Jan. 12, 1978

[30] Foreign Application Priority Data

Jan. 31, 1977 [NL] Netherlands .................... 7700969

[51] Int. Cl.² .................... H03F 3/45; H03F 3/16
[52] U.S. Cl. .................... 330/253; 330/255; 330/257; 330/288
[58] Field of Search .............. 330/253, 255, 257, 264, 330/288

[56] References Cited

U.S. PATENT DOCUMENTS 3,979,689  9/1976  Schade .................... 330/257

Primary Examiner—James B. Mullins
Attorney, Agent, or Firm—Thomas A. Briody; William J. Streeter; Henry I. Steckler

[57] ABSTRACT

An amplifier arrangement with a class-B output stage comprising two complementary current mirrors whose output circuits are included in series between supply terminals. The input circuits of these current mirrors are driven by output circuits of a third and a fourth current mirror, which current mirrors each couple the drain electrodes of two transistors which respectively constitute a first and a second differential amplifier with common input terminals.

6 Claims, 2 Drawing Figures

AMPLIFIER ARRANGEMENT

The invention relates to an amplifier arrangement with a first amplifier stage for amplifying a signal and applying said amplified signal to a second amplifier stage, which second amplifier stage comprises a first and a second current mirror, which second current mirror in respect of its function is complementary to the first current mirror, in particular in that this current mirror comprises semiconductor elements which are of a conductivity type which is opposite to the conductivity type of the corresponding semiconductor elements of the first current mirror, of which current mirrors the output circuits are connected in series between a first and a second supply terminal, the output circuits at the sides which are remote from the respective supply terminals being connected to an output terminal.

Such a circuit arrangement is inter alia included in an integrated circuit with the type number TBA 700 of N. V. Philips' Gloeilampenfabrieken. In this circuit arrangement the first amplifier stage is constituted by a differential amplifier consisting of two emitter-coupled transistors, of which the two collector currents are each applied to one of the input circuits of said current mirrors. Because the quiescent currents in the output circuits of these current mirrors are oppositely directed relative to the output terminal and the signal current components are in phase relative to said output terminal, a signal current which is free from quiescent current can be taken from the output terminal. Such an output is designated a class A output.

For some applications, for example in those cases where minimum dissipation is required, a class B output is desirable, which is an output for which the two circuits leading to said output carry no or relative to the signal current comparatively little quiescent current and each circuit carries one of the two directional components of the output signal current.

It is an object of the invention to provide an amplifier arrangement of the type mentioned in the preamble with a class-B output and for this the invention is characterized in that the first amplifier stage comprises a first and a second output circuit which are mutually voltage-decoupled, means for the in-phase drive of the two output circuits of said first amplifier stage and quiescent current adjusting means for adjusting said output circuits so as to be substantially quiescent-current free, the first output circuit being connected to first supply terminal via the input circuit of the first current mirror and the second output circuit being connected to the second supply terminal via the input circuit of the second current mirror.

The invention is based on the recognition that if a quiescent-current free output current of the amplifier is applied to a supply terminal via the input circuit of a current mirror, only one of the two directional components is transferred and is applied to the output circuit in mirror-inverted form. By applying each of two such output currents to one of two complementary current mirrors, a class-B output is obtained. The two current mirrors may then produce current gain.

In-phase driven of the two output circuits may be achieved in several manners. In this respect a first preferred embodiment is characterized in that the first amplifier stage comprises a first differential amplifier with a first and a second transistor whose control electrodes are connected to a first and a second input terminal respectively, the first output circuit of the first amplifier stage being constituted by the drain circuit of the second transistor, a second differential amplifier with a third and a fourth transistor whose control electrodes are connected to the first and the second input terminal respectively the second output circuit of the first amplifier stage being constituted by the drain circuit of the fourth transistor, a third current mirror whose input circuit is included in the drain circuit of the first transistor and whose output circuit leads to the drain electrode of the second transistor and to the input circuit of the first current mirror, and a fourth current mirror whose input circuit is included in the drain circuit of the third transistor and whose output circuit leads to the drain electrode of the fourth transistor and to the input circuit of the second current mirror.

For the two differential amplifiers it may be advantageous that the first, second, third and fourth transistors are of a first conductivity type, that the second current mirror comprises semiconductors of said first conductivity type and the first, third and fourth current mirrors comprise semiconductors of a second conductivity type. Both differential amplifiers are then identical in respect of conductivity type. The number of transistors may then be reduced, because the first and the third transistor and the input circuits of the third and the fourth current mirror are in common.

In the embodiments in which the two differential amplifiers are identical in respect of conductivity type it is advantageous in respect of the D.C. level of the second output circuit that in the drain circuit of the fourth transistor between its drain electrode and the second output circuit a fifth current mirror of the second conductivity type is included whose input circuit is included in the drain circuit of the fourth transistor, and a sixth current mirror of the first conductivity type whose input circuit is included in the output circuit of the fifth current mirror and whose output circuit leads to the input circuit of the second current mirror.

The input voltage range of the preferred embodiment can be increased in that the first and second transistors are of a first conductivity type, the first and the third current mirror comprise semiconductor elements of a second conductivity type, the third and fourth transistors are of the second conductivity type, and that the second and the fourth current mirror comprise semiconductor elements of the first conductivity type.

Figure 2:
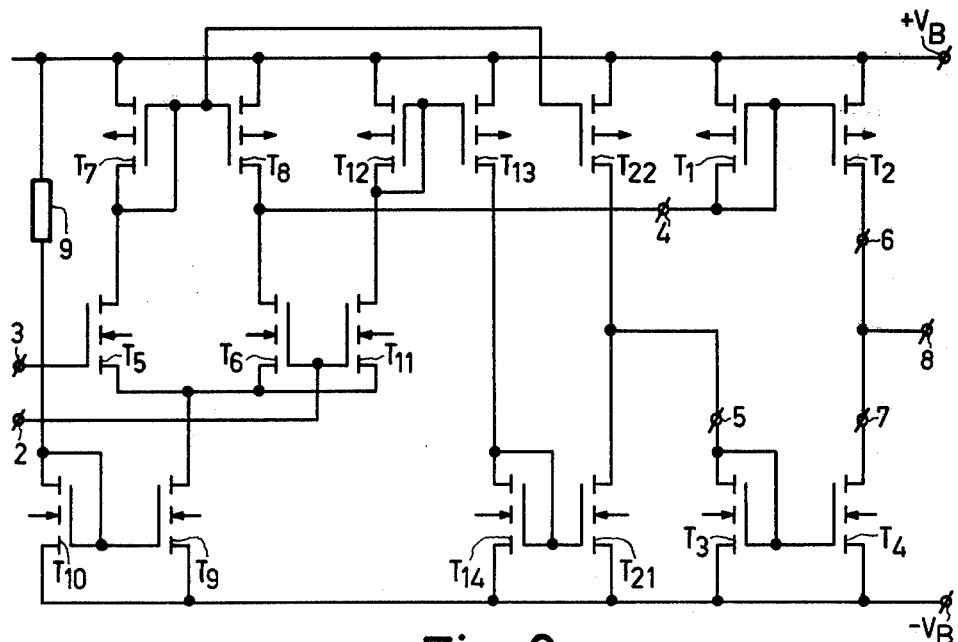

The invention will now be described in more detail with reference to the drawing, in which FIG. 1 shows a first embodiment of the invention, and FIG. 2 shows a second embodiment of the invention.

FIG. 1 shows an embodiment of the invention using MOS transistors. The first amplifier stage comprises two differential amplifiers. The first differential amplifier comprises an n-channel transistor $T_5$ and an n-channel transistor $T_6$, the control electrodes of the transistors $T_5$ and $T_6$ respectively being connected to the input terminals 3 and 2, and the source electrodes to the drain electrode of an n-channel transistor $T_9$ which functions as a current source. For this purpose the source electrode of the transistor $T_9$ is connected to a negative supply terminal $-V_B$ and the gate electrode to the gate electrode of an n-channel transistor $T_{10}$ whose source electrode is connected to the supply terminal $-V_B$ and whose drain electrode is connected to its gate electrode. Transistors $T_9$ and $T_{10}$ thus together constitute a current mirror. The input current for this mirror is obtained by connecting the drain electrode of transistor $T_{10}$ to a positive supply terminal $+V_B$ via a resistor 9. The signal current is coupled out to the drain circuit of transistor $T_6$ by mirror-inverting the drain current of transistor $T_5$ relative to the positive supply terminal $+V_B$. For this purpose the first differential amplifier comprises a p-channel transistor $T_7$ whose drain electrode is connected to the drain electrode of transistor $T_5$. The gate electrode of transistor $T_7$ is connected to its drain electrode and to the gate electrode of a p-channel transistor $T_8$. The source electrodes of the transistors $T_7$ and $T_8$ are connected to the positive supply terminal $+V_B$. The drain electrode of transistor $T_8$ is connected to an output terminal 4 to which also the drain electrode of transistor $T_6$ is connected.

When transistors $T_7$ and $T_8$ are identical, the quiescent current in the drain circuit of transistor $T_8$ is equal to the quiescent current in the drain circuit of transistor $T_6$ and the signal currents are in phase opposition. Thus, an output current which is free from quiescent current is available at output 4. A slight inequality of the transistors $T_7$ and $T_8$ results in a small D.C. component in the output current, which may be desirable in order to reduce distortion.

The second differential amplifier is identical to the first differential amplifier, with the proviso that the corresponding transistors of the two differential amplifiers are of the opposite conductivity type and that the supply terminals have been interchanged. The transistors $T_5$, $T_6$, $T_7$, $T_8$, $T_9$, $T_{10}$, resistor 9, inputs 2 and 3 of the first differential amplifier correspond to the transistors $T_{15}$, $T_{16}$, $T_{17}$, $T_{18}$, $T_{19}$, $T_{20}$, resistor 10, inputs 2 and 3, and output 5 respectively. In a similar way as in the first differential amplifier an output current which is substantially free from quiescent current can be available at output 5 in phase with a signal at input terminal 2 and consequently in phase with the output current at output 4.

The second amplifier stage consists of two mutually complementary current mirrors. A first current mirror comprises p-channel transistors $T_1$ and $T_2$. The source electrodes of these transistors $T_1$ and $T_2$ are connected to the positive supply terminals $+V_B$ and the gate electrodes are connected to the drain electrode of transistor $T_1$, which is connected to output 4.

As transistor $T_1$ can conduct in one direction only, only one of the two directional components of the current which can be available at output 4 flows through transistor $T_1$ and is applied to the drain electrode of transistor $T_2$ in mirror-inverted form. The other directional component is suppressed in that the voltage across transistor $T_1$ becomes smaller than the threshold voltage, so that transistor $T_8$ is saturated (source-drain voltage smaller than source-gate voltage).

The second current mirror of the second amplifier stages comprises the n-channel transistors $T_3$ and $T_4$. The source electrodes of the transistors $T_3$ and $T_4$ are connected to the negative supply terminal $-V_B$ and the gate electrodes are connected to the drain electrode of transistor $T_3$, which is connected to output 5.

In a similar way as with the first mirror $T_1$, $T_2$, transistor $T_3$ will pass only one of two directional components of the signal current which is available at output 5. As this mirror is complementary to the mirror $T_1$, $T_2$ this is the other directional component not passed by transistor $T_1$ relative to the input voltage between inputs 1 and 2. The drain electrodes of transistors $T_2$ and $T_4$ thus alternately carry one polarity of the signal current obtained from the input voltage. As the drain electrodes of the transistors $T_2$ and $T_4$ are connected to an output 8, a current with both polarities will flow through output 8, when said output is connected to a load $R_1$. In this way the transistors $T_2$ and $T_4$ constitute a class-B output stage. By selecting the current gain factors of the mirrors $T_7$, $T_8$ and $T_{17}$, $T_{18}$ slightly smaller than unity, a small quiescent current will flow in the output stage which reduces distortion.

Owing to the symmetrical design of the circuit arrangement of FIG. 1 in respect of the conductivity types and supply voltages, the output voltage range is maximum.

FIG. 2 shows an other embodiment in accordance with the invention. In a similar way as the amplifier arrangement in accordance with FIG. 1 it comprises a second amplifier stage consisting of the first and second current mirror with transistors $T_1$, $T_2$, $T_3$ and $T_4$ and an output 8. Similarly, it comprises a first differential amplifier (with $T_5$, $T_6$, $T_7$, $T_8$, $T_9$, $T_{10}$ and 9) identical to that of FIG. 1. The second differential amplifier is constituted by a differential amplifier which is identical to the first differential amplifier, i.e., with transistors of a corresponding conductivity type. This second differential amplifier has been combined, as far as possible, with the first differential amplifier and is constituted by the current source 9, $T_{10}$, $T_9$ and the transistors $T_5$ and $T_{11}$, the source electrode of transistor $T_{11}$ being connected to the drain electrode of transistor $T_9$ and the gate electrode to the gate electrode of transistor $T_6$. If transistor $T_{11}$ is identical to transistor $T_6$ the drain current of transistor $T_{11}$ substantially equal the drain current of transistor $T_6$.

As the output current of the second differential amplifier in the second amplifier stage is mirror-inverted relative to the negative supply voltage $-V_B$ and the minimum drain voltage level of transistor $T_{11}$ is too high for this, the drain electrode of transistor $T_{11}$ is connected to the drain electrode of a p-channel transistor $T_{12}$, whose drain electrode is connected to the gate electrode of a p-channel transistor $T_{13}$, the source electrode being connected to the positive supply terminal $+V_B$. As a result of this the drain current of transistor $T_{11}$ is mirror-inverted relative to the positive supply terminal $+V_B$ and applied to the drain electrode of transistor $T_{13}$. In a similar way the drain current of transistor $T_{13}$ is mirror inverted via a mirror consisting of the n-channel transistors $T_{14}$ and $T_{21}$ relative to the negative supply terminal $-V_B$ and applied to the drain electrode of transistor $T_{21}$. If the overall gain in this mirror circuit between the drain electrodes of transistors $T_{11}$ and $T_{21}$ equals unity, the drain current of transistor $T_{21}$ is equal to the drain current of transistor $T_{11}$ and consequently equal to that of transistor $T_6$.

Coupling-out of the second differential amplifier $T_5$, $T_{11}$ by means of a current mirror is effected by including a p-channel transistor $T_{22}$ in the drain circuit of transistor $T_{21}$. The gate electrode of this transistor is connected to the gate electrode of transistor $T_7$ and the source electrode to the positive supply terminal $+V_B$. In this way the drain current of transistor $T_5$ is mirror-inverted and applied to the drain electrode of transistor $T_{22}$.

The drain electrodes of the transistors $T_{21}$ and $T_{22}$ are connected to the output terminal 5 at which a signal current which is free from quiescent current is available. The operation of the second amplifier stage $T_1$, $T_2$, $T_3$ and $T_4$ is identical to that of the circuit arrangement in accordance with FIG. 1.

The invention is by no means limited to the embodiments shown. There are various methods of obtaining two output signal circuits which are driven in phase and which are substantially free from quiescent current. Furthermore there are also many methods of realizing the various current mirrors, for example it is possible to include resistors in the source circuits of the various current-mirror transistors. In respect of the embodiments shown it may be advantageous to combine the circuit arrangement of FIGS. 1 and 2 by joining two circuit arrangements in accordance with FIG. 2, with transistors which are complementary relative to each other, in a similar way as in the circuit arrangement in accordance with FIG. 1.

What is claimed is:

1. An amplifier arrangement comprising first amplifier stage for amplifying a signal, a second amplifier stage coupled to said first stage, said second amplifier stage comprising a first and a second current mirror, each current mirror comprising input circuits and semiconductor elements having a conductivity type which is opposite to the conductivity type of the corresponding semiconductor elements of the other current mirror, said current mirrors having output circuits coupled in series between a first and a second supply terminal, the output circuits at the sides which are remote from the respective supply terminals being coupled to an output terminal, the first amplifier stage comprising a first and a second output circuit which are mutually voltage-decoupled, means for the in-phase drive of the two output circuits of said first amplifier stage and quiescent current adjusting means for adjusting said output circuits so as to be substantially quiescent-current free, the first output circuit being coupled to first supply terminal through the input circuit of the first current mirror and the second output circuit being coupled to the second supply terminal through the input circuit of the second current mirror.

2. An amplifier arrangement as claimed in claim 1, wherein the first amplifier stage comprises a first differential amplifier including a first and a second transistor having control electrodes coupled to a first and a second input terminal respectively, each of said transistors having a drain electrode, the first output circuit of the first amplifier stage being coupled to the drain electrode of the second transistor, a second differential amplifier including a third and a fourth transistor having control electrodes coupled to the first and the second input terminal respectively, said third and fourth transistors each having a drain electrode, the second output circuit of the first amplifier stage being coupled to the drain electrode of the fourth transistor, a third current mirror having an input circuit coupled to the drain electrode of the first transistor and an output circuit coupled to the drain electrode of the second transistor and to the input circuit of the first current mirror, and a fourth current mirror having an input circuit coupled to the drain electrode of the third transistor and an output circuit coupled to the drain electrode of the fourth transistor and to the input circuit of a second current mirror.

3. An amplifier arrangement as claimed in claim 2, wherein the first, second, third, and fourth transistors comprise a first conductivity type, the second current mirror comprises semiconductors of said first conductivity type, and the first, third, and fourth current mirrors comprise semiconductors of a second conductivity type.

4. An amplifier arrangement as claimed in claim 3, wherein the first and the third transistors and the input circuits of the third and fourth current mirrors are in common.

5. An amplifier arrangement as claimed in claim 3 further comprising a fifth current mirror of the second conductivity type coupled to the input circuit of the fourth current mirror and having an input circuit coupled to the drain circuit of the fourth transistor and an output circuit, and a sixth current mirror of the first conductivity type having an input circuit coupled to the output circuit of the fifth current mirror and an output circuit coupled to the input circuit of the second current mirror.

6. An amplifier arrangement as claimed in claim 2, wherein the first and second transistors are of a first conductivity type, the first and the third current mirror comprise semiconductor elements of a second conductivity type, the third and fourth transistor are of the second conductivity type, and the second and the fourth current mirror comprise semiconductor elements of the first conductivity type.

* * * * *